(12) United States Patent
Zhao et al.

(10) Patent No.: US 11,100,868 B2
(45) Date of Patent: Aug. 24, 2021

(54) DISPLAY DEVICES, DISPLAY PANELS AND CAPACITANCE COMPENSATION METHOD THEREOF

(71) Applicant: KUNSHAN GO-ViSIONOX OPTO-ELECTRONICS CO., LTD., Kunshan (CN)

(72) Inventors: Guohua Zhao, Kunshan (CN); Jianlong Wu, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 0 days.

(21) Appl. No.: 16/923,091

(22) Filed: Jul. 8, 2020

(65) Prior Publication Data

US 2020/0335043 A1 Oct. 22, 2020

Related U.S. Application Data

(63) Continuation-in-part of application No. PCT/CN2019/103160, filed on Aug. 29, 2019.

(30) Foreign Application Priority Data

Oct. 26, 2018 (CN) .......................... 201811260459.X

(51) Int. Cl.
*G09G 3/3266* (2016.01)
*G09G 3/36* (2006.01)
*H01L 27/32* (2006.01)

(52) U.S. Cl.
CPC ......... *G09G 3/3266* (2013.01); *G09G 3/3648* (2013.01); *G09G 2310/0221* (2013.01);
(Continued)

(58) Field of Classification Search
CPC ............. H01L 27/3223; H01L 27/3225; H01L 27/3276; H01L 27/3265; G09G 3/3225;
(Continued)

(56) References Cited

U.S. PATENT DOCUMENTS 10,867,565 B2 * 12/2020 Chu ........................ G02F 1/1362
2018/0129106 A1 * 5/2018 Gao ....................... G09G 3/3611
(Continued)

FOREIGN PATENT DOCUMENTS

| CN | 107424551 A | 12/2017 |
|---|---|---|
| CN | 107481669 A | 12/2017 |

(Continued)

*Primary Examiner* — Sardis F Azongha
(74) *Attorney, Agent, or Firm* — Kilpatrick Townsend & Stockton

(57) ABSTRACT

The present application provides a display device, a display panel and a capacitance compensation method thereof. A standard for performing a capacitance compensation on row scan lines in a first display region having fewer pixel units is that total load capacitance of a row scan line of a row adjacent to a second display region is equal to self-load capacitance of a row scan line of any row in the second display region, and that total load capacitance of each of the row scan lines decreases smoothly from the row adjacent to the second display region to a row away from the second display region.

19 Claims, 6 Drawing Sheets

(52) U.S. Cl.
CPC .. *G09G 2320/0233* (2013.01); *H01L 27/3265* (2013.01); *H01L 27/3276* (2013.01)

(58) Field of Classification Search
CPC ......... G09G 3/3266; G09G 2320/0223; G09G 2320/0233
See application file for complete search history.

(56) References Cited

U.S. PATENT DOCUMENTS

| | | | |
|---|---|---|---|
| 2018/0158417 A1 | 6/2018 | Xiang et al. | |
| 2018/0204889 A1 | 7/2018 | Yu et al. | |
| 2019/0181213 A1* | 6/2019 | Lim | G09G 3/3266 |
| 2019/0280227 A1 | 9/2019 | Zhou et al. | |

FOREIGN PATENT DOCUMENTS

| | | |
|---|---|---|
| CN | 107705756 A | 2/2018 |
| CN | 107749247 A | 3/2018 |
| CN | 107749287 A | 3/2018 |
| CN | 107863374 A | 3/2018 |
| CN | 108352151 A | 7/2018 |
| CN | 108389516 A | 8/2018 |
| CN | 108598127 A | 9/2018 |
| CN | 108648627 A | 10/2018 |
| CN | 109061975 A | 12/2018 |
| EP | 3627480 A1 | 3/2020 |
| JP | 2008052092 A | 3/2008 |

\* cited by examiner

Row number

Row number

DISPLAY DEVICES, DISPLAY PANELS AND CAPACITANCE COMPENSATION METHOD THEREOF

CROSS REFERENCES TO RELATED APPLICATIONS

This application is a continuation under 35 U.S.C. § 120 of international patent application PCT/CN2019/103160, entitled "DISPLAY DEVICES, DISPLAY PANELS AND CAPACITANCE COMPENSATION METHOD THEREOF" filed on Aug. 29, 2019, which claims priority from China Patent Application No. 201811260459.X, filed on Oct. 26, 2018 in the China National Intellectual Property Administration, the contents of both applications are hereby incorporated by reference.

TECHNICAL FIELD

The present application relates to the field of display device technology, and particularly relates to a display device.

BACKGROUND

In recent years, display devices, especially those based on organic light emitting diodes (OLEDs), have been widely used.

When the display panel is applied to a mobile terminal product, a mounting hole may be necessarily to be disposed in the display region to reserve a location on the mobile terminal device, to install hardware such as a front camera, a handset, or a "Home" button.

However, the number of pixel units in a row where the mounting hole is located is less than the number of pixel units in a row where no mounting hole is provided. Accordingly the load of the scan line of the row where the mounting hole is located is different from that of the row where no mounting hole is provided, which causes bright and dark stripes in the display region, namely, a problem of uneven display brightness.

SUMMARY

The present application provides a display device, a display panel and a capacitance compensation method thereof, which can solve the problem of uneven display brightness in a display region having fewer pixel units.

A display panel, includes a first display region and a second display region adjacent to each other, the first display region and the second display region each include a pixel array formed by multiple pixel units, and multiple row scan lines; the pixel array includes multiple rows of pixel units; and each of the row scan lines drives the pixel units in a corresponding row of the multiple rows of pixel units; a same number of the pixel units are provided in each row in the second display region; the number of the pixel units provided in each row in the first display region is less than a number of the pixel units provided in each row in the second display region; each of the row scan lines in the first display region is connected to a corresponding compensation capacitor; and a sum of a self-load capacitance of each of the row scan lines and capacitance of a corresponding compensation capacitor connected thereto is total load capacitance of the each of the row scan lines; total load capacitance of a row scan line of a row in the first display region and adjacent to the second display region is equal to self-load capacitance of any one of the row scan lines in the second display region; and the total load capacitance of each of the row scan lines in the first display region decreases smoothly from the row adjacent to the second display region to a row away from the second display region.

A display device includes the aforementioned display panel.

A capacitance compensation method applied to a display panel, the display panel includes a first display region and a second display region adjacent to each other; the first display region and the second display region each include a pixel array formed by multiple pixel units, and multiple row scan lines; the pixel array includes multiple rows of pixel units; and each of the row scan lines drives the pixel units in a corresponding row of the multiple rows of pixel units; a same number of the pixel units are provided in each row in the second display region; the number of the pixel units provided in each row in the first display region is less than a number of the pixel units provided in each row in the second display region; each of the row scan lines in the first display region is connected to a corresponding compensation capacitor; and a sum of a self-load capacitance of each of the row scan lines and capacitance of a corresponding compensation capacitor connected thereto is total load capacitance of the each of the row scan lines.

The method includes: performing a capacitance compensation on a row scan line of a row adjacent to the second display region and in the first display region, to make the total load capacitance of the row scan line of the row, which is adjacent to the second display region and in the first display region, equal to self-load capacitance of a row scan line of an adjacent row in the second display region; and performing a capacitance compensation on each of the row scan lines in the first display region except the row scan line of the row adjacent to the second display region, to make the total load capacitance of each of the row scan lines decrease smoothly from the row adjacent to the second display region to the row away from the second display region.

In an embodiment, the performing a capacitance compensation on each of the row scan lines in the first display region except the row scan line of the row adjacent to the second display region, to make the total load capacitance of each of the row scan lines decrease smoothly from the row adjacent to the second display region to the row away from the second display region, includes: obtaining a preset ratio for a capacitance compensation; performing the capacitance compensation on a row scan line of a row farthest away from the second display region and in the first display region, wherein compensation capacitance for the capacitance compensation is equal to a product of the preset ratio and a difference between self-load capacitance of any one of the row scan lines in the second display region and the self-load capacitance of the row scan line of the row farthest away from the second display region; and performing a capacitance compensation on each of the row scan lines of rows, which are in the first display region and between the row farthest away from the second display region and the row adjacent to the second display region, to make differences between the total load capacitance values of the row scan lines of any adjacent two rows equal, from the row adjacent to the second display region to the row away from the second display region.

In the present application, a capacitance compensation is performed on each of the row scan lines in the first display region having fewer pixel units, and the standard for the capacitance compensation is that the total load capacitance of the row scan line of the row adjacent to the second display region is equal to the self-load capacitance of the row scan line of any row in the second display region, and that the total load capacitance of each row scan line decreases smoothly from the row adjacent to the second display region to the row away from the second display region. The above solution, based on a fact that human are insensitive to a gradual change in brightness, eliminates sudden changes in the total load capacitance of the compensated row scan lines in the first display region and in the boundary between the first display region and the second display region, thereby achieving a uniform display. In addition, the gradual change in the total load capacitance in the first display region can reduce the area for disposing the compensation capacitors, which has beneficial effects of reducing the area of the frame region, achieving a narrow frame, and increasing the screen-to-body ratio.

In an optional embodiment, in the first display region, the total load capacitance of each of the row scan lines decreases linearly from the row adjacent to the second display region to the row away from the second display region. Compared with a monotonically decreasing method, the linearly decreasing method makes human less sensitive to the brightness change.

In an optional embodiment, the first display region is located at an upper portion or a lower portion of the display panel. In other words, the upper portion or the lower portion of the display panel has a pixel-free region, and the pixel-free region can be an opening region. The opening region can be circular, oval, rectangular, trapezoidal, inverted trapezoidal, triangular, notch-shaped or irregular. One or more of the following functional elements may be disposed in the opening: a camera, a handset, a light sensor, a distance sensor, an iris recognition sensor, and a fingerprint recognition sensor. A shape of the opening region matches a shape of the one or more of the functional elements disposed in the opening.

In an embodiment, the row scan lines in the first sub-display region and the row scan lines in the second sub-display region are correspondingly disconnected with each other at the pixel-free region, the row scan lines in the first sub-display region are connected to one driving circuit, and the row scan lines of the second sub-display region are connected to another driving circuit. In other words, the first display region is driven bilaterally. In other optional solutions, the row scan lines in the first sub-display region and the row scan lines in the second sub-display region are not disconnected with each other at the pixel-free region, and the row scan lines in the first sub-display region and the row scan lines in the second sub-display region are connected to a same driving circuit, that is, the first display region is driven unilaterally. Regardless of unilateral driving or bilateral driving, the first sub-display region and the second sub-display region can be symmetrical with respect to the pixel-free region. In this case, in order to facilitate the circuit layout, each of the row scan lines in the first sub-display region and each of the row scan lines of the second sub-display region are connected to a compensation capacitor respectively.

In an optional embodiment, in the first display region, each of the compensation capacitors connected to one of the corresponding row scan lines includes multiple compensation capacitor units connected in series. The advantages of the compensation capacitor units are that the compensation capacitor units not only have the same capacitance but also have the same size. In a limited area, such as an area with a size of a mobile phone screen, a relative error caused in the process of producing the compensation capacitor units is relatively small. In this case, the number of compensation capacitor units for each row is: a quotient obtained by exactly dividing the capacitance of each of the compensation capacitors connected to each of corresponding row scan lines by the capacitance of one compensation capacitor unit, or in an indivisible case, a rounded maximum quotient plus one or minus one, where the quotient is obtained by dividing the capacitance of each of the compensation capacitors connected to each of the corresponding row scan lines by the capacitance of one compensation capacitor unit.

In an optional embodiment, a) the compensation capacitors are arranged between adjacent pixel units, and one plate of the compensation capacitor is the row scan line, and this structure can avoid the production of one plate, thereby reducing the process steps; or b) the compensation capacitors are arranged in the frame region adjacent to the first display region; or c) the compensation capacitors are arranged in the region adjacent to both the pixel-free region and the first display region. Compared with the solution a), the last two structures can reduce the gaps between adjacent pixel units, and have the beneficial effects of increasing the number of pixel units in a limited area, thus improves the resolution. Compared with the solution in which the total load capacitance values of the row scan lines are equal, the solution, in which the total load capacitance of each of the row scan lines in the first display region has a decreasing trend, can reduce the area for disposing the compensation capacitor.

As for solution a), the other plate of the compensation capacitor is electrically connected to the power line. For solution b), one plate of the compensation capacitor is disposed at the conductive layer where the row scan line is arranged, or is disposed at the conductive layer electrically connected to the corresponding row scan line via a conductive plug; and the other plate of the compensation capacitor is electrically connected to the power line. The other plate of the compensation capacitor can also be electrically connected to, besides the power line, another connection line with a fixed potential such as a common electrode line. The advantage of the other plate being electrically connected to a connection line with a fixed potential is that the series-parallel relationship between the compensation capacitor and the self-capacitor of the row scan line is fixed, which is convenient for calculating the capacitance of the compensation capacitor.

In an optional embodiment, the compensation capacitance of a row scan line of a row in the first display region and farthest away from the second display region is calculated by multiplying a preset ratio and a difference between self-load capacitance of the row scan line of the row farthest away from the second display region and the self-load capacitance of any one of the row scan lines in the second display region. When the preset ratio and a change trend of the total load capacitance is determined, the compensation capacitance of each row is determined accordingly. The preset ratio is set according to an industry standard for uniformity of the display brightness of the display region in the display industry. Within an allowable setting range of the preset ratio, which meets the industry standard, the smaller the preset ratio is, the more beneficial it is to decrease in the capacitance of the compensation capacitor, that is, the more beneficial it is to decrease in the area for disposing the compensation capacitor.

DETAILED DESCRIPTION OF THE EMBODIMENTS

Through analysis, the reason for the display unevenness of the display panel is that: if, in the display panel, the structures and the sizes of all scan lines are consistent, and the structures and the sizes of all pixel units are consistent, then an overlapping area between each scan line and each pixel unit is fixed, accordingly, a decrease in the number of pixel units in a row may cause a self-load capacitance of a scan line in the same row to be different from self-load capacitance of scan lines of other rows. The self-load capacitance of the scan line refers to a capacitance of a capacitor including one plate formed by the scan line and another plate formed by a conductive layer, where the conductive layer and the scan line are arranged in different layers but overlap each other. The conductive layer can be a conductive layer in the pixel units, such as cathodes or anodes in the OLED pixel units, or a conductive layer in transistors driving the pixel units, such as connection lines electrically connected to sources/drains. The load capacitance of the scan lines being unequal means that when control electrical signals are provided for the scan lines, discharge currents generated by the charged capacitors in the discharge processes are unequal, which in turn causes delays of the rising and falling edges of the control electrical signals for the scan lines thus causing light and dark stripes during display, that is, a problem of uneven display brightness of the pixel units in each row.

Based on the above analysis, in the present application, a capacitance compensation is performed on each of the row scan lines in the first display region having fewer pixel units, and the standard for the capacitance compensation is that the total load capacitance of the row scan line of the row adjacent to the second display region is equal to the self-load capacitance of the row scan line of any row in the second display region, and that the total load capacitance of each row scan line decreases smoothly from the row adjacent to the second display region to the row away from the second display region. The above solution, based on a fact that human are insensitive to a gradual change in brightness, eliminates sudden changes in the total load capacitance of the compensated row scan lines in the first display region and in the boundary between the first display region and the second display region, thereby achieving a uniform display.

In addition, the gradual change in the total load capacitance in the first display region can reduce the area for disposing the compensation capacitors, which has beneficial effects of reducing the area of the frame region, achieving a narrow frame, and increasing the screen-to-body ratio.

Embodiments of the present application will be described in detail below by making reference to the accompanying drawings.

Figure 1:
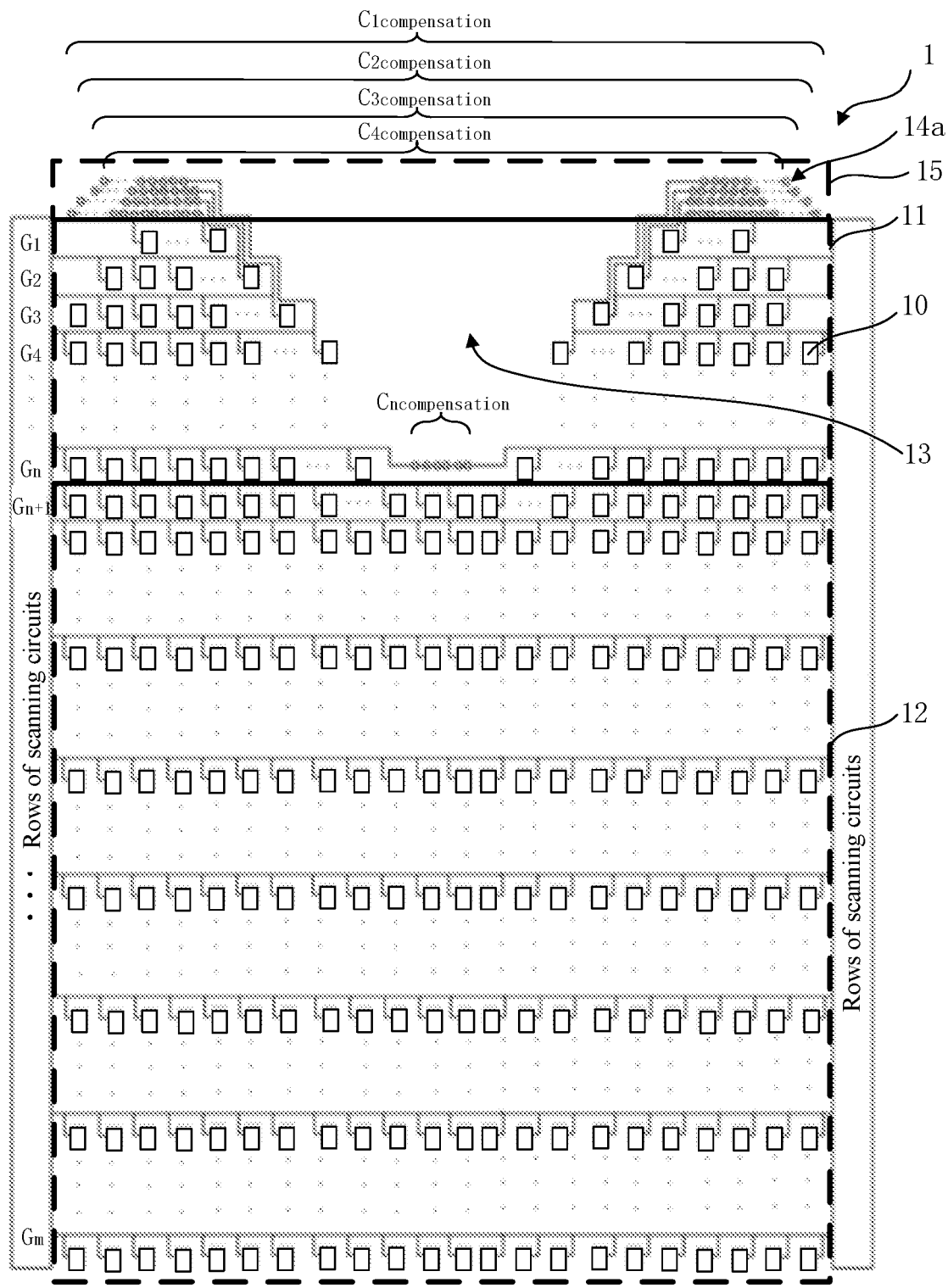
FIG. 1 is a schematic structural diagram illustrating a display panel of an embodiment of the present application.
Figure 2:
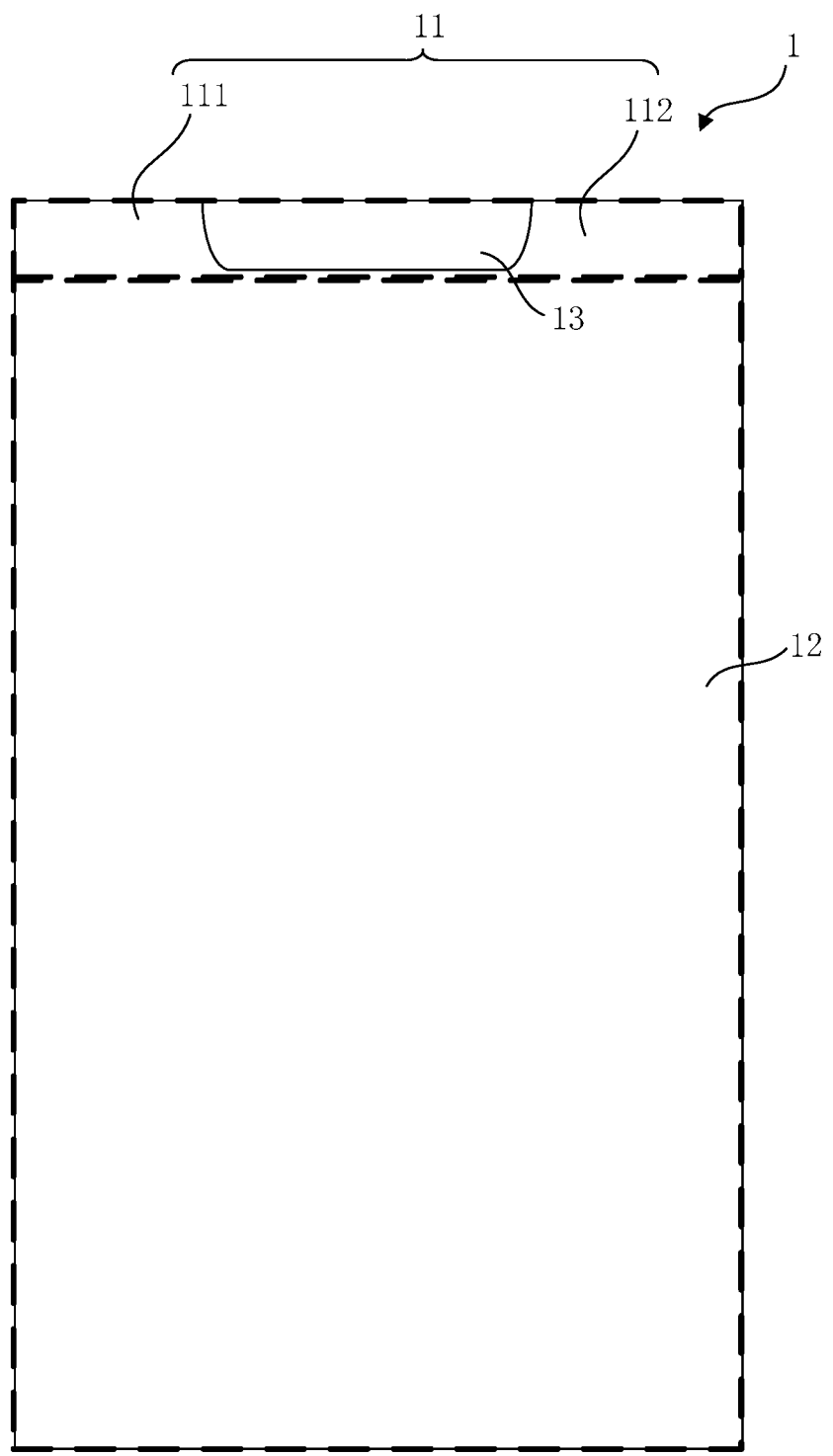
FIG. 2 is a diagram illustrating divided regions of the display panel in FIG. 1.

FIG. 1 is a schematic structural diagram illustrating a display panel of an embodiment of the present application. FIG. 2 is a diagram illustrating divided regions of the display panel in FIG. 1.

Referring to FIGS. 1 and 2, the display panel 1 includes a first display region 11 and a second display region 12 adjacent to each other. The first display region 11 includes a pixel array formed by multiple pixel units 10, and multiple row scan lines $G_1, G_2, \ldots, G_n$. The pixel array includes multiple rows of pixel units 10, and each of the row scan lines $G_1, G_2, \ldots, G_n$ drives the pixel units 10 in a corresponding row of the multiple rows of pixel units 10. The second display region 12 includes a pixel array formed by multiple pixel units 10 and multiple row scan lines $G_{n+1}, G_{n+2}, \ldots, G_m$. The pixel array includes multiple rows of pixel units 10, and each of the row scan lines $G_{n+1}, G_{n+2}, \ldots, G_m$ respectively drives the pixel units 10 in a corresponding row of the multiple rows of pixel units 10.

A same number of the pixel units 10 are provided in each row in the second display region 12, and the number of the pixel units 10 provided in each row in the first display region 11 is less than the number of the pixel units 10 provided in each row in the second display region 12. The row scan lines $G_1, G_2, \ldots, G_n$ in the first display region 11 each are connected to corresponding compensation capacitors $C_{1compensation}, C_{2compensation}, \ldots, C_{ncompensation}$. A sum of a self-load capacitance of each of the row scan lines $G_1, G_2, \ldots, G_n$ and corresponding compensation capacitance of each of the compensation capacitors $C_{1compensation}, C_{2compensation}, \ldots, C_{ncompensation}$ correspondingly connected thereto is total load capacitance $C_{1total}, C_{2total}, \ldots, C_{ntotal}$ of each of the corresponding row scan lines $G_1, G_2, \ldots, G_n$.

In the first display region 11, the total load capacitance $C_{ntotal}$ of the row scan line $G_n$ of the row adjacent to the second display region 12 is always equal to the self-load capacitance of any one of the row scan lines $G_{n+1}, G_{n+2}, \ldots, G_m$ in the second display region, and the total load capacitance $C_n$ total, $C_{(n-1)\ total}, \ldots, C_{1\ total}$ of each of the corresponding row scan lines $G_n, G_{n-1}, \ldots, G_1$ decreases smoothly from the row adjacent to the second display region 12 to the row away from the second display region.

Optionally, as shown in FIGS. 1 and 2, the first display region 11 is disposed at an upper portion of the display panel 1, and the second display region 12 is disposed at a lower portion of the display panel 1. In other embodiments, the second display region 12 can also be disposed at the upper portion of the display panel 1, and the first display region 11 can be disposed at the lower portion of the display panel 1.

In an embodiment, as shown in FIGS. 1 and 2, the first display region 11 is provided with a pixel-free region 13. In order to fit the pixel-free region 13, the number of the pixel units 10 in each row in the first display region 11 is less than the number of the pixel units 10 in any row in the second display region 12. The pixel-free region 13 divides the first display region 11 into a first sub-display region 111 and a second sub-display region 112 on the left and right sides. The row scan lines $G_1, G_2, \ldots, G_n$ in the first sub-display region 111 and those in the second sub-display region 112 can be correspondingly disconnected or connected with each other in the pixel-free region 13 or not. For the solution of disconnection, the row scan lines $G_1, G_2, \ldots, G_n$ in the first sub-display region 111 are connected to one driving circuit, and the row scan lines $G_1, G_2, \ldots, G_n$ in the second sub-display region 112 are connected to another driving circuit, that is, the first display region is driven bilaterally. For the solution of connection, the row scan lines $G_1, G_2, \ldots, G_n$ in the first sub-display region 111 and the second sub-display region 112 are connected to a same driving circuit, and the first display region is driven unilaterally. Regardless of unilateral driving or bilateral driving, the first sub-display region and the second sub-display region can be symmetrical with respect to the pixel-free region. In this case, in order to facilitate the circuit layout, each of the row scan lines in the first sub-display region and each of the row scan lines of the second sub-display region are connected to a compensation capacitor respectively.

The pixel-free region 13 may be an opening region. One of or a combination of a camera, a handset, a light sensor, a distance sensor, an iris recognition sensor, and a fingerprint recognition sensor can be disposed in an opening defined in the opening region.

In FIGS. 1 and 2, the opening region is notch-shaped, and in other optional solutions, the opening region can also be circular, oval, rectangular, trapezoidal, inverted trapezoidal, triangular, drop-shaped, notch-shaped, or irregular. The shape of the opening region matches the shape of the functional element disposed in the opening region, or although the functional element is not disposed in the opening region, the shape of the opening region matches the usage requirements of the functional element.

In other embodiments, the first display region 11 may not be provided with the pixel-free region. In this case, in each row of pixel units 10, one or more pixel units 10 are removed at intervals; or two top corners of the first display region 11 are arc-shaped.

In an embodiment, the compensation capacitance of the row scan line of the row in the first display region and farthest away from the second display region is calculated by multiplying a preset ratio and a difference between the self-load capacitance of the row scan line of the row farthest away from the second display region and the self-load capacitance of any row scan line in the second display region. When the preset ratio and a change trend of the total load capacitance is determined, the compensation capacitance of each row is determined accordingly. The preset ratio is set according to an industry standard for uniformity of the display brightness of the display region in the display industry. Within an allowable setting range of the preset ratio, which meets the industry standard, the smaller the preset ratio is, the more beneficial it is to decrease in the capacitance of the compensation capacitor, that is, the more beneficial it is to decrease in the area for disposing the compensation capacitor.

In an embodiment, a capacitance compensation method is provided. Taking the method applied to the display panel shown in FIG. 1 as an example, the method can include the following steps.

As shown in FIG. 1, in the first display region 11, row scan lines $G_1, G_2, \ldots, G_n$ each are connected to corresponding compensation capacitors $C_{1compensation}, C_{2compensation}, \ldots, C_{ncompensation}$. Suppose the number of pixel units 10 in a first row is denoted by $P_1$; the number of pixel units 10 in a second row is denoted by $P_2$; ...; the number of pixel units 10 in an n-th row is denoted by $P_n$; numbers of pixel units 10 in an (n+1)-th to an m-th rows each are denoted by $P_{n+1}$; and capacitance values respectively formed between pixel units 10 and corresponding row scan lines G connected thereto are equal, and specifically are denoted by $C_P$.

Then self-load capacitance $C_1$ of a first row scan line $G_1$ is equal to $P_1C_P$; self-load capacitance $C_2$ of a second row scan line $G_2$ is equal to $P_2C_P$; ...; self-load capacitance $C_n$ of an n-th row scan line $G_n$ is equal to $P_nC_P$; and self-load capacitance $C_{n+1}$ of an (n+1)-th row scan line $G_{n+1}$ is equal to $P_{n+1}C_P$.

At Step 1, perform a capacitance compensation on a row scan line of a row in the first display region and adjacent to the second display region, so that the total load capacitance of the row scan line of the row in the first display region and adjacent to the second display region is equal to the self-load capacitance of a row scan line of the adjacent row in the second display region.

Taking FIG. 1 as an example, firstly, a capacitance compensation can be performed on the n-th row scan line, so that the total load capacitance $C_{n\ total}$ is equal to the self-load capacitance $C_{n+1}$ of the (n+1)-th row scan line $G_{n+1}$. Then the capacitance of the compensation capacitor $C_{ncompensation}$ of the n-th row scan line $G_n$ is equal to $(P_{n+1}-P_n)C_P$.

At Step 2, perform a capacitance compensation on each of row scan lines in the first display region except the row scan line of the row adjacent to the second display region, so that the total load capacitance of each of the row scan lines decreases smoothly from the row adjacent to the second display region to the row away from the second display region.

In an embodiment, specifically, the performing a capacitance compensation on each of row scan lines in the first display region except the row scan line of the row adjacent to the second display region includes following steps.

Obtain a preset ratio for a capacitance compensation.

Perform the capacitance compensation on a row scan line of a row farthest away from the second display region and in the first display region, where compensation capacitance for the capacitance compensation is equal to a product of the preset ratio and a difference between a self-load capacitance of any one of the row scan lines in the second display region and the self-load capacitance of the row scan line of the row farthest away from the second display region.

Perform a capacitance compensation on each of the row scan lines of rows, which are in the first display region and between the row farthest away from the second display region and the row adjacent to the second display region, to make differences between the total load capacitance values of the row scan lines of any adjacent two rows equal, from the row adjacent to the second display region to the row away from the second display region.

Taking FIG. 1 as an example, in an embodiment, a linearly increased compensation can be performed on the first row scan line $G_1$ to the (n−1)-th row scan line $G_{n-1}$.

A difference between the self-load capacitance $C_1$ of the first row scan line $G_1$ and the total load capacitance $C_{ntotal}$ of the n-th row scan line $G_n$ is equal to $(P_{n+1}-P_1)C_P$.

Assume that a capacitance compensation ratio of the first row scan line $G_1$ is t, where: 0<t<100%, and t is preset. In this case, the capacitance of the compensation capacitor $C_{1compensation}$ of the first row scan line $G_1$ is equal to $t(P_{n+1}-P_1)C_P$; the total load capacitance $C_{1total}$ of the first row scan line $G_1$ is $C_1+C_{1compensation}=[(tP_{n+1}+(1-t)]C_P$. The compensation ratio t is determined by the following factors: a display brightness difference between adjacent rows in the first display region is less than or equal to 3%. The calculation method of the brightness difference is: $\Delta A = |(A_{n+1}-$ $A_n)/A_{n+1}|$. Where A denotes brightness; ΔA denotes the brightness difference; n denotes the row number and is a positive integer.

Since this compensation method is linear, a total load capacitance difference ΔC between adjacent rows is $$(C_{ntotal}-C_{1total})/(n-1)=(1-t)(P_{n+1}-P_1)\ C_P/(n-1).$$

In this way, the total load capacitance $C_{2total}$ of the second row scan line $G_2$ is $$C_{1total}+\Delta C=[(tP_{n+1}+(1-t)P_1)]C_P+(1-t)(P_{n+1}-P_1)C_P/(n-1);$$

the capacitance of the compensation capacitor $C_{2compensation}$ is $$C_{1total}+\Delta C-P_2C_P=[(tP_{n+1}+(1-t)P_1)-P_2]C_P+(1-t)(P_{n+1}-P_1)C_P/(n-1);\ and$$

the compensation ratio of the second row scan line $G_2$ is $$[C_{1total}+\Delta C-P_2C_P]/[(P_{n+1}-P_1)C_P].$$

The total load capacitance $C_{3total}$ of the third row scan line $G_3$ is $$C_{1total}+2\Delta C=[(tP_{n+1}+(1-t)P_1)]C_P+2(1-t)(P_{n+1}-P_1)C_P/(n-1);$$

the capacitance of the compensation capacitor $C_{3compensation}$ is $$C_{1total}+2\Delta C-P_3C_P=[(tP_{n+1}+(1-t)P_1)-P_3]C_P+2(1-t)(P_{n+1}-P_1)C_P/(n-1);\ and$$

the compensation ratio of the third row scan line $G_3$ is $$[C_{1total}+2\Delta C-P_3{}^*C_P]/[(P_{n+1}-P_1)C_P];$$

. . .

The total load capacitance value $C_{(n-1)total}$ of the (n–1)-th row scan line $G_{n-1}$ is $$C_{1total}+(n-2)\Delta C=[(t^*P_{n+1}+(1-t)^*P_1)]^*C_P+(n-2)^*(1-t)^*(P_{n+1}-P_1)^*C_P/(n-1);$$

the capacitance of the compensation capacitor $C_{(n-1)compensation}$ is $$C_{1total}+(n-2)\Delta C-P_{n-1}C_P=[(t\ P_{n+1}+(1-t)P_1)-P_{n-1}]C_P+(n-2)(1-t)(P_{n+1}-P_1)C_P/(n-1);\ and$$

the compensation ratio of the (n–1)-th row scan line $G_{n-1}$ is $$[C_{1total}+(n-2)\Delta C-P_{n-1}C_P]/[(P_{n+1}-P_1)C_P].$$

Figure 3:
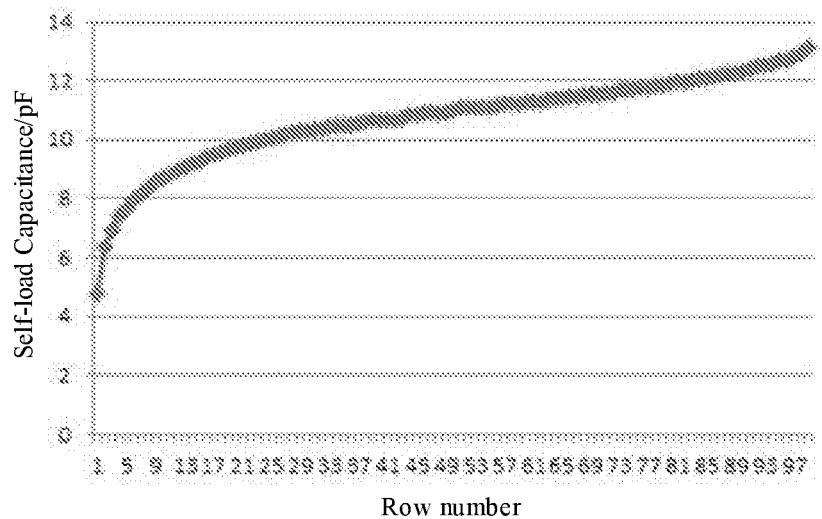
FIG. 3 is a graph showing a relationship between self-load capacitance of each row scan line in a first display region and a corresponding row number.
Figure 4:
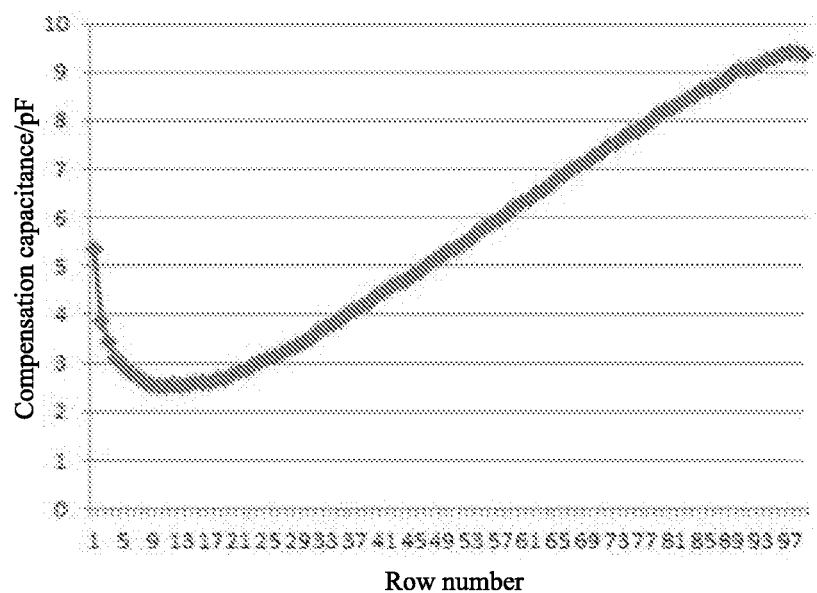
FIG. 4 is a graph showing a relationship between compensation capacitance of each row scan line in the first display region and a corresponding row number.
Figure 5:
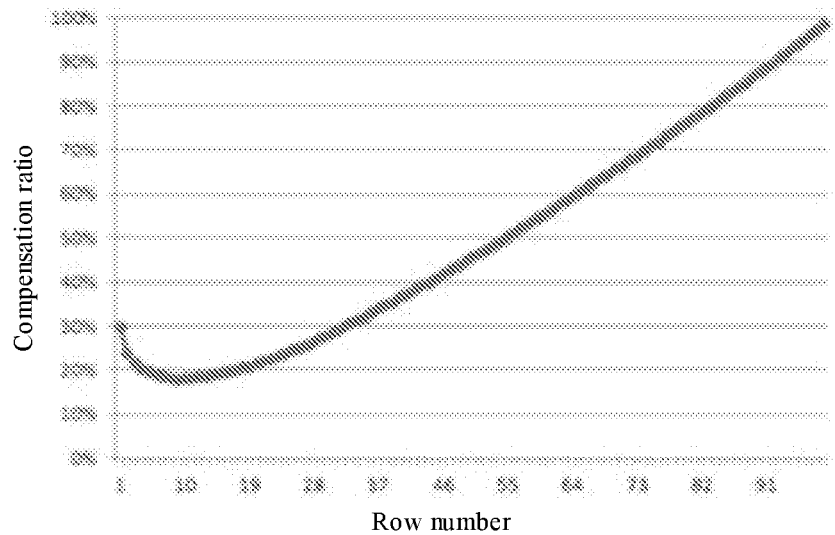
FIG. 5 is a graph showing a relationship between a capacitance compensation ratio of each row scan line in the first display region and a corresponding row number.
Figure 6:
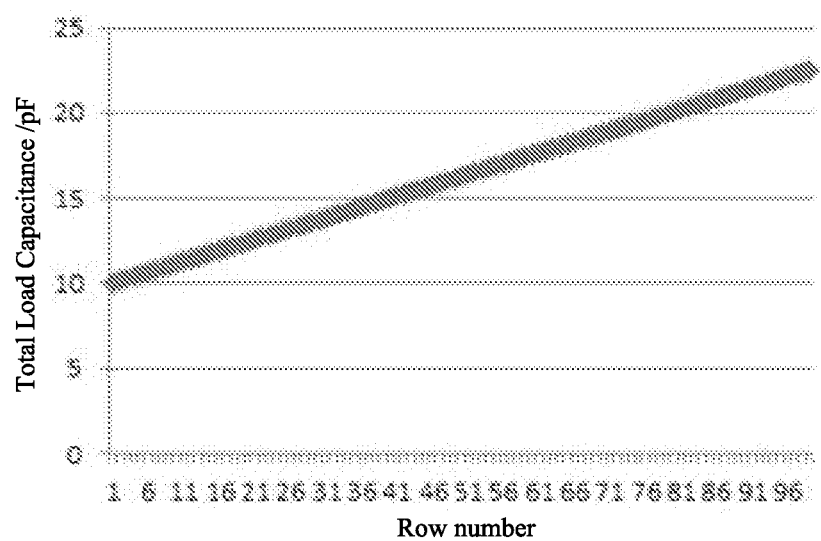
FIG. 6 is a graph showing a relationship between total load capacitance of each compensated row scan line in the first display region and a corresponding row number.

Taking t being 30% and n being 100 as an example, FIG. 3 is a graph showing a relationship between self-load capacitance of each of the row scan lines G1, G2, . . . , G100 in a first display region and a corresponding row number; FIG. 4 is a graph showing a relationship between compensation capacitance of each of the row scan lines G1, G2, . . . , G100 in the first display region and a corresponding row number; FIG. 5 is a graph showing a relationship between a capacitance compensation ratio of each of the row scan lines G1, G2, . . . , G100 in the first display region and a corresponding row number; FIG. 6 is a graph showing a relationship between total load capacitance of each of the compensated row scan lines G1, G2, . . . , G100 in the first display region and a corresponding row number; and FIG. 7 is a diagram illustrating a simulation result of uniformity of driving currents of the row scan lines in the first display region after capacitance is compensated.

Figure 7:
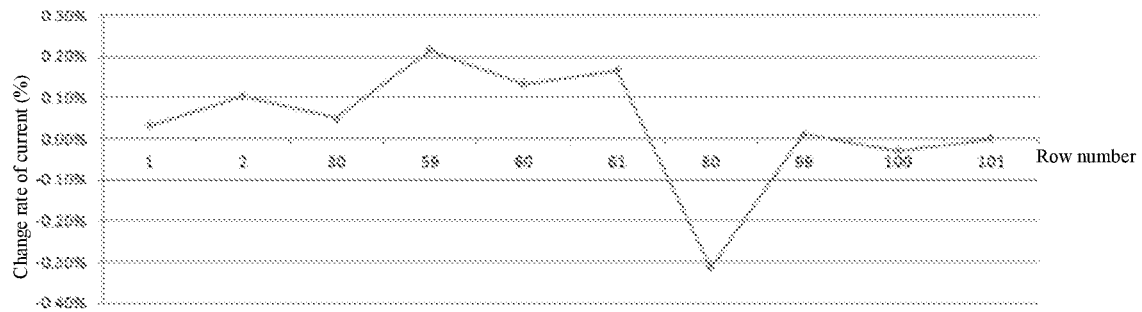
FIG. 7 is a diagram illustrating a simulation result of uniformity of driving currents of row scan lines in the first display region after capacitance is compensated.

It can be seen from FIG. 7 that the maximum fluctuation range of the driving currents in the first row scan line to the n-th row scan line $G_1, G_2, \ldots, G_n$ is about 0.3% based on the driving current in the row scan line of the 101st row. Compared with the fluctuation range of about 6% before the compensation, the stability of the driving currents in the row scan lines is significantly improved, thereby solving the problem of bright and dark stripes caused by the brightness change in the display panel. In addition, when the display brightness difference between adjacent rows is less than 1%, the display effect is better.

In addition, as can be seen in FIGS. 4 and 5, for the notch-shaped pixel-free region 13, the compensation capacitance of each of the row scan lines $G_1, G_2, \ldots, G_{100}$ in the first display region 11 decreases first and then increases, therefore the corresponding area of each compensation capacitor decreases first and then increases.

In the capacitance compensation method of the above embodiments, in the first display region, the total load capacitance of each of the row scan lines decreases linearly from the row adjacent to the second display region to the row away from the second display region. Compared with a monotonically decreasing method, the linearly decreasing method makes human less sensitive to the brightness change.

In other embodiments, the above linear change trend can also be a monotonically decreasing curve such as a parabola. In this case, the differences each between values of the total load capacitance $C_{1total}, C_{2total}, \ldots, C_{ntotal}$ of the row scan lines $G_1, G_2, \ldots, G_n$ of adjacent rows are unequal.

As shown in FIG. 1, in the first display region 11, each of the compensation capacitors $C_{1compensation}, C_{2compensation}, \ldots, C_{ncompensation}$ connected to one of the corresponding row scan lines $G_1, G_2, \ldots, G_n$, includes multiple compensation capacitor units 14a connected in series. The advantages of the compensation capacitor units are that the compensation capacitor units 14a not only have the same capacitance but also have the same size. In a limited area, such as an area with a size of a mobile phone screen, a relative error caused in the process of producing the compensation capacitor units 14a is relatively small. In this case, the number of compensation capacitor units for each row is: a quotient obtained by exactly dividing the capacitance of each of the compensation capacitors $C_{1compensation}, C_{2compensation}, \ldots, C_{ncompensation}$ connected to each of corresponding row scan lines $G_1, G_2, \ldots, G_n$ by the capacitance of one compensation capacitor unit 14a, or in an indivisible case, a rounded maximum quotient plus one or minus one, where the quotient is obtained by dividing the capacitance of each of the compensation capacitors $C_{1compensation}, C_{2compensation}, \ldots, C_{ncompensation}$ connected to each of the corresponding row scan lines $G_1, G_2, \ldots, G_n$ by the capacitance of one compensation capacitor unit 14a.

As for the notch-shaped pixel-free area 13, as shown in FIGS. 4 and 5, the compensation capacitance of each of the respective row scan lines $G_1, G_2, \ldots, G_{100}$ in the first display region 11 decreases firstly and then increases, so that the corresponding compensation capacitance area decreases firstly and then increases, and the number of the compensation capacitor units also decreases firstly and then increases.

For a solution in which the first sub-display region 111 and the second sub-display region 112 are symmetrical with respect to the pixel-free region 13, the number of the compensation capacitor units 14a connected to each of the row scan lines in the first sub-display region 111 and the number of the compensation capacitor units 14a connected to each of the row scan lines of the second sub-display region 112 can be equal.

In addition, in FIG. 1, some of compensation capacitor units 14a of the row scan lines $G_2, \ldots, G_n$ are disposed in the frame region 15 adjacent to the first display region 11, and some of compensation capacitor units 14a are disposed in a region adjacent to both the pixel-free region 13 and the first display region 11. The smoothly changed compensation capacitors can save the layout area and have beneficial effects of achieving a narrow frame. Compared with the structure that the compensation capacitor units 14a are arranged between adjacent pixel units 10, the structure, which the compensation capacitor units 14 are arranged in the frame region 15 adjacent to the first display region 11 or arranged in the region adjacent to both the pixel-free region 13 and the first display region 11, can reduce the gaps between adjacent pixel units, and has the beneficial effects of increasing the number of pixel units in a limited area, thus improves the resolution. In addition, compared with the solution in which the total load capacitance values of the row scan lines are equal, the solution, in which the total load capacitance of each of the row scan lines in the first display region has a decreasing trend, can reduce the area for disposing the compensation capacitor.

Figure 8:
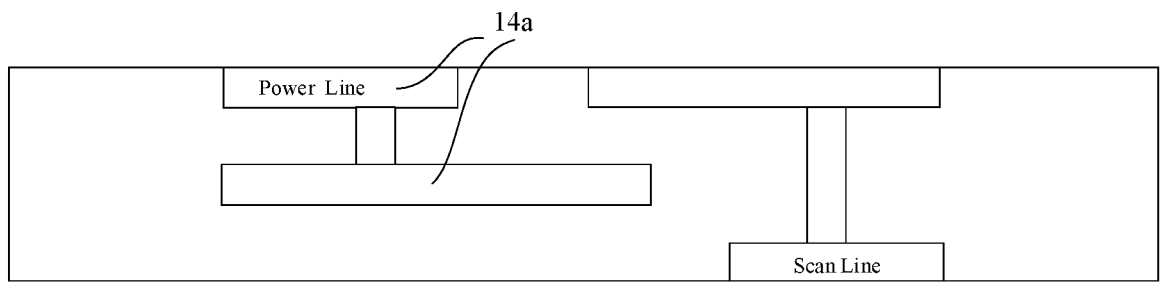
FIG. 8 is a schematic diagram illustrating a double-plate structure of a compensation capacitor unit.

FIG. 8 is a schematic diagram illustrating a double-plate structure of a compensation capacitor unit. Referring to FIG. 8, one plate of each compensation capacitor unit 14a is disposed at a conductive layer where the row scan line is arranged (scheme a), or disposed at a conductive layer electrically connected to the corresponding row scan line via a conductive plug (scheme b); and the other plate of the compensation capacitor unit 14a is disposed at a conductive layer where the power line is arranged (scheme c), or is disposed at the conductive layer electrically connected to the power line via the conductive plug (scheme d). The other plate of the compensation capacitor unit 14a is electrically connected to the power line. The other plate of the compensation capacitor can also be electrically connected to, besides the power line, another connection line with a fixed potential such as a common electrode line. The advantage of the other plate being electrically connected to a connection line with a fixed potential is that the series-parallel relationship between the compensation capacitor and the self-capacitor of the row scan line is fixed, which is convenient for calculating the capacitance of the compensation capacitor.

In an embodiment, a whole piece of compensation capacitor can be provided, or multiple pieces of compensation capacitors with different sizes can be provided.

In an embodiment, when two top corners of the first display region 11 are arc-shaped, the corners of the first few rows of pixel units are not necessarily provided with pixel units 10, which also reduces the self-load capacitance of the row scan lines of the first several rows.

In an embodiment, corners of the first display region are right angles, and compensation capacitance of a row scan line of a row farthest away from the second display region and in the first display region is greater than compensation capacitance of a row scan line of a row adjacent to the row farthest away from the second display region.

In an embodiment, the pixel units 10 are OLED pixel units, and the corresponding display panel 1 is an OLED display panel. In another optional solution, the pixel units 10 can also be pixel units driven by thin-film transistors (TFTs) and transmitting light twisted by liquid crystal, and the corresponding display panel 1 is a liquid crystal display panel. This application does not limit the light emitting manner of the pixel unit.

The display panel 1, as a semi-finished product, can be integrated or assembled together with other components to form a display device such as a mobile phone, a tablet computer (PAD), and a vehicle-mounted display screen.

Figure 9:
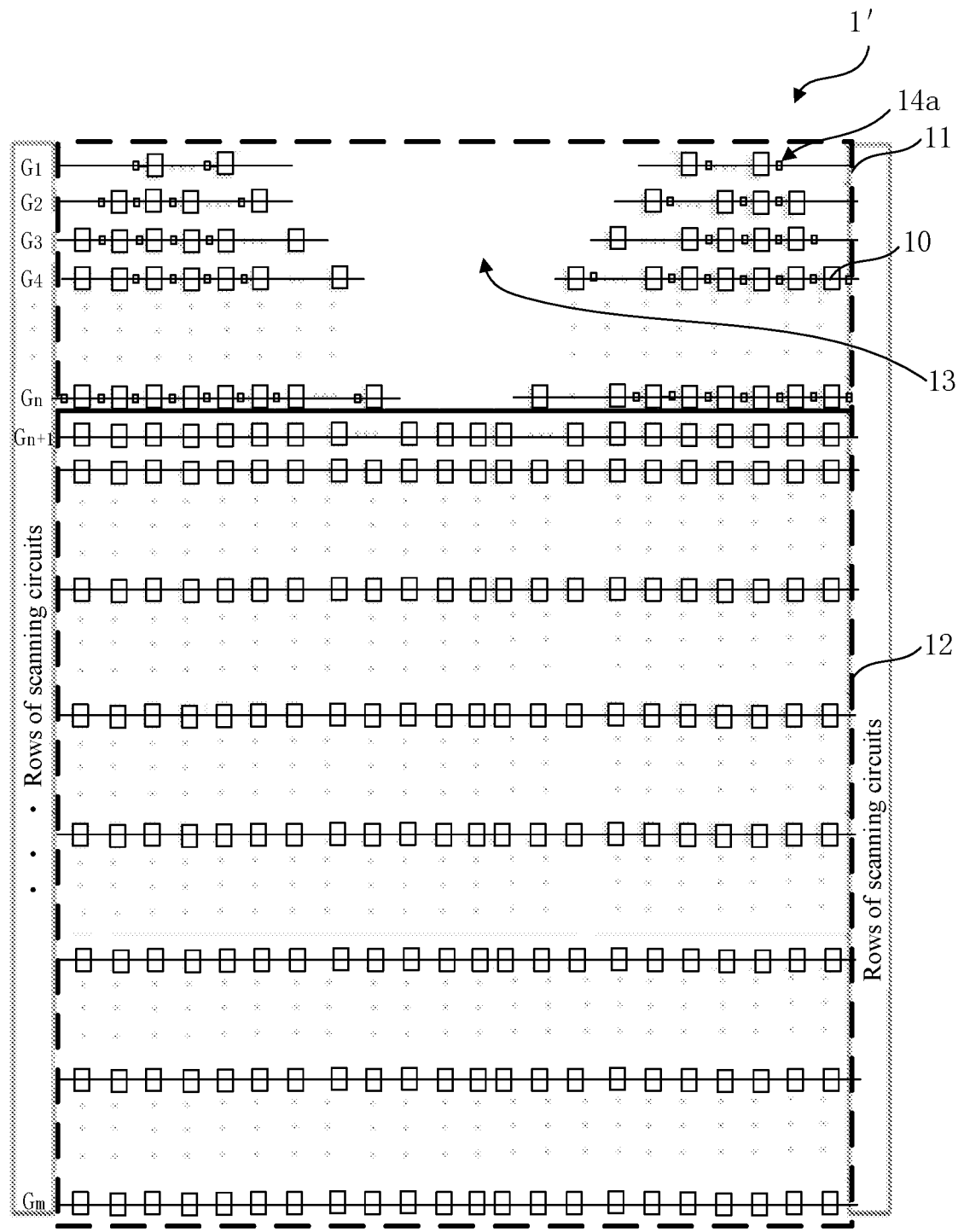
FIG. 9 is a schematic diagram illustrating a display panel of another embodiment of the present application.

FIG. 9 is a schematic diagram illustrating a display panel of another embodiment of the present application. The structure of the display panel 1' of this embodiment is substantially the same as that of the display panel 1 in FIG. 1, except that each compensation capacitor unit 14a is disposed between adjacent pixel units 10. One plate of each compensation capacitor unit 14a can be electrically connected to a potential-fixed connection line such as a power line, or a common electrode line, for example, one plate of each compensation capacitor unit 14a can be disposed at a conductive layer where a power line is arranged, or disposed at a conductive layer electrically connected to the power line via a conductive plug. The corresponding row scan line can act as the other plate of the compensation capacitor unit 14a. This structure can avoid the production of one plate, thereby reducing the process steps.

Although this application is disclosed as above, this application is not limited thereto. Any person skilled in the art can make various variations and modifications without departing from the spirit and scope of the present application. Therefore, the protection scope of the present application should be subject to the scope defined by the claims.

What is claimed is:

1. A display panel comprising:
a first display region and a second display region adjacent to each other, the first display region and the second display region respectively comprising a pixel array including a plurality of pixel units, and a plurality of row scan lines, each pixel array comprising a plurality of rows of pixel units, each of the row scan lines being configured to drive the pixel units in a corresponding row of the plurality of rows of pixel units;
wherein:
each row in the second display region have a same number of pixel units;
the number of the pixel units provided in each row in the first display region is less than a number of the pixel units provided in each row in the second display region;
each of the row scan lines in the first display region is connected to a corresponding compensation capacitor; and
a sum of a self-load capacitance of each of the row scan lines and capacitance of a corresponding compensation capacitor connected thereto is total load capacitance of each of the row scan lines;
a total load capacitance of a row scan line of a row located in the first display region and adjacent to the second display region is equal to self-load capacitance of any one of the row scan lines in the second display region; and
the total load capacitance of each of the row scan lines in the first display region decreases smoothly from the row adjacent to the second display region to a row away from the second display region;
a compensation capacitance of each row is associated with a preset ratio and a change trend of the total load capacitance of each of the row scan lines, the preset ratio being associated with a factor that a display brightness difference between adjacent rows in the first display region is less than or equal to a preset value.

2. The display panel according to claim 1, wherein the total load capacitance of each of the row scan lines in the first display region decreases linearly from the row adjacent to the second display region to the row away from the second display region.

3. The display panel according to claim 1, wherein the first display region comprises a pixel-free region, a first sub-display region and a second sub-display region; both sides of the pixel-free region are respectively adjacent to the first sub-display region and the second sub-display region; and the row scan lines in the first sub-display region and/or the second sub-display region are respectively connected to the corresponding compensation capacitors.

4. The display panel according to claim 3, wherein the row scan lines in the first sub-display region and the row scan lines in the second sub-display region are correspondingly disconnected with each other at the pixel-free region, the row scan lines in the first sub-display region are connected to one driving circuit, and the row scan lines in the second sub-display region are connected to another driving circuit.

5. The display panel according to claim 4, wherein the first sub-display region and the second sub-display region are symmetrical with respect to the pixel-free region, and each of the row scan lines in the first sub-display region and each of the row scan lines in the second sub-display region are connected to the compensation capacitor respectively.

6. The display panel according to claim 3, wherein corners of the first display region are right angles, and compensation capacitance of a row scan line of a row farthest away from the second display region and in the first display region is greater than compensation capacitance of a row scan line of a row adjacent to the row farthest away from the second display region.

7. The display panel according to claim 3, wherein the pixel-free region is an opening region, and the opening region is circular, oval, rectangular, trapezoidal, inverted trapezoidal, triangular, notch-shaped or irregular.

8. The display panel according to claim 7, wherein at least one of functional elements is disposed in an opening in the opening region, and the functional elements comprise a camera, a handset, a light sensor, a distance sensor, an iris recognition sensor, and a fingerprint recognition sensor.

9. The display panel according to claim 8, wherein a shape of the opening region matches a shape of one of the functional elements disposed in the opening.

10. The display panel according to claim 1, wherein each of the corresponding compensation capacitors connected to each of the row scan lines comprises a plurality of compensation capacitor units connected in series.

11. The display panel of claim 10, wherein:
each of the compensation capacitor units is disposed between adjacent pixel units;
a first plate of each of the compensation capacitor units is a row scan line; and
a second plate of each of the compensation capacitor units is disposed at a conductive layer where a power line is arranged, or disposed at a conductive layer electrically connected to the power line via a conductive plug.

12. The display panel according to claim 10, wherein the compensation capacitor units are arranged in a frame region adjacent to the first display region, and/or arranged in a region adjacent to both the pixel-free region and the first display region; one plate of each of the compensation capacitor units is disposed at a conductive layer where corresponding one of the row scan lines is arranged, or is disposed at a conductive layer electrically connected to corresponding one of the row scan lines via a conductive plug; and another plate of each of the compensation capacitor units is disposed at a conductive layer where a power line is arranged, or disposed at a conductive layer electrically connected to the power line via a conductive plug.

13. The display panel according to claim 1, wherein the pixel units are OLED pixel units, and the display panel is an OLED display panel.

14. The display panel of claim 1, wherein each of the compensation capacitors comprises a plurality of compensation capacitor units, and each of the compensation capacitor units is arranged between adjacent pixel units.

15. A display panel comprising:
a first display region and a second display region adjacent to each other, the first display region and the second display region respectively comprising a pixel array including a plurality of pixel units, and a plurality of row scan lines, each pixel array comprising a plurality of rows of pixel units, each of the row scan lines being configured to drive the pixel units in a corresponding row of the plurality of rows of pixel units;
wherein:
each row in the second display region have a same number of pixel units;
the number of the pixel units provided in each row in the first display region is less than a number of the pixel units provided in each row in the second display region;
each of the row scan lines in the first display region is connected to a corresponding compensation capacitor; and
a sum of a self-load capacitance of each of the row scan lines and capacitance of a corresponding compensation capacitor connected thereto is total load capacitance of each of the row scan lines;
a total load capacitance of a row scan line of a row located in the first display region and adjacent to the second display region is equal to self-load capacitance of any one of the row scan lines in the second display region; and
the total load capacitance of each of the row scan lines in the first display region decreases smoothly from the row adjacent to the second display region to a row away from the second display region;
wherein a compensation capacitance of a row scan line, which is farthest away from the second display region, of the row scan lines in the first display region, is calculated by multiplying a preset ratio and a difference between self-load capacitance of the row scan line of the row farthest away from the second display region and the self-load capacitance of any one of the row scan lines in the second display region.

16. The display panel according to claim 15, wherein the preset ratio is greater than 0 and less than 100%.

17. The display panel according to claim 15, wherein the preset ratio is determined by a factor that a display brightness difference between adjacent rows in the first display region is less than or equal to a preset value.

18. A method for providing capacitance compensation of a display panel, the display panel comprising a first display region and a second display region adjacent to each other,
the first display region and the second display region respectively comprising a pixel array including a plurality of pixel units, and a plurality of row scan lines, each pixel array comprising a plurality of rows of pixel units, each of the row scan lines being configured to drive the pixel units in a corresponding row of the plurality of rows of pixel units,
the pixel units being provided in each row in the second display region have a same number, the number of the pixel units provided in each row in the first display region being less than a number of the pixel units provided in each row in the second display region; each of the row scan lines in the first display region is connected to a corresponding compensation capacitor, a sum of a self-load capacitance of each of the row scan lines and capacitance of a corresponding compensation capacitor connected thereto being a total load capacitance of the each of the row scan lines, the method comprising:

performing a capacitance compensation on a row scan line of a row adjacent to the second display region and in the first display region, to make the total load capacitance of the row scan line of the row adjacent to the second display region and in the first display region equal to self-load capacitance of a row scan line of an adjacent row in the second display region; and performing a capacitance compensation on each of the row scan lines in the first display region except the row scan line of the row adjacent to the second display region, to make the total load capacitance of each of the row scan lines decrease smoothly from the row adjacent to the second display region to the row away from the second display region;

wherein a compensation capacitance of a row scan line of a row farthest away from the second display region and in the first display region, is equal to a product of the preset ratio and a difference between self-load capacitance of any one of the row scan lines in the second display region and the self-load capacitance of the row scan line of the row farthest away from the second display region.

19. The method according to claim 18, wherein the performing a capacitance compensation on each of the row scan lines in the first display region except the row scan line of the row adjacent to the second display region, to make the total load capacitance of each of the row scan lines decrease smoothly from the row adjacent to the second display region to the row away from the second display region, comprises:

obtaining a preset ratio for a capacitance compensation;

performing the capacitance compensation on the row scan line of the row farthest away from the second display region and in the first display region; and performing a capacitance compensation on each of the row scan lines of rows, which are in the first display region and between the row farthest away from the second display region and the row adjacent to the second display region, to make differences between the total load capacitance values of the row scan lines of any adjacent two rows equal, from the row adjacent to the second display region to the row away from the second display region.

* * * * *